United States Patent
Horak et al.

(10) Patent No.: US 7,943,919 B2
(45) Date of Patent: *May 17, 2011

(54) INTEGRATED CIRCUIT WITH UPSTANDING STYLUS

(75) Inventors: David V. Horak, Essex Junction, VT (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 392 days.

This patent is subject to a terminal disclaimer.

(21) Appl. No.: 10/732,579

(22) Filed: Dec. 10, 2003

(65) Prior Publication Data

US 2005/0127348 A1   Jun. 16, 2005

(51) Int. Cl.
*H01L 45/00* (2006.01)
(52) U.S. Cl. ..................... 257/3; 257/E21.645
(58) Field of Classification Search ............. 257/2–5, 257/296, E23.645
See application file for complete search history.

(56) References Cited

U.S. PATENT DOCUMENTS

| | | | |
|---|---|---|---|
| 6,420,725 B1 * | 7/2002 | Harshfield | 257/4 |
| 6,586,761 B2 | 7/2003 | Lowrey | |
| 6,707,085 B2 * | 3/2004 | Jang et al. | 257/295 |
| 6,815,823 B2 * | 11/2004 | Teh et al. | 257/758 |
| 6,940,085 B2 * | 9/2005 | Fricke et al. | 257/4 |
| 7,012,273 B2 * | 3/2006 | Chen | 257/4 |
| 7,049,623 B2 * | 5/2006 | Lowrey | 257/3 |
| 7,319,057 B2 * | 1/2008 | Lowrey | 438/200 |
| 2004/0077123 A1 * | 4/2004 | Lee et al. | 438/102 |
| 2005/0098896 A1 * | 5/2005 | Huang et al. | 257/760 |
| 2007/0048945 A1 * | 3/2007 | Czubatyj et al. | 438/282 |

* cited by examiner

*Primary Examiner* — Nathan W Ha
(74) *Attorney, Agent, or Firm* — Law Offices of Charles W. Peterson, Jr.; Wan Yee Cheung, Esq.; Vazken Alexanian

(57) ABSTRACT

A stylus, an integrated circuit (IC) and method of forming the IC. The stylus extends upward from its apex and has a substantially circular cross section that decreases in diameter upward from the apex. The stylus is formed in a mold that may be formed in an orifice in a dielectric layer between wiring layers. The mold may include multiple concentric layers. For a more pronounced, non-linear stylus taper, each layer may be thinner than its next adjacent outer concentric layer.

17 Claims, 17 Drawing Sheets

INTEGRATED CIRCUIT WITH UPSTANDING STYLUS

CROSS REFERENCE TO RELATED APPLICATION

The present invention is related to U.S. application Ser. No. 10/732,582, now published as U.S. Patent Application Publication No. 2005/0127350, entitled "FIELD EMISSION PHASE CHANGE DIODE MEMORY" and to U.S. application Ser. No. 10/732,580, now published as U.S. Patent Application Publication No. 2005/0127349 entitled "PHASE CHANGE TIP STORAGE CELL" both to David V. Horak et al., filed coincident herewith and assigned to the assignee of the present invention.

BACKGROUND OF THE INVENTION

1. Field of the Invention

The present invention is related to solid state storage and particularly to solid state storage cells with a phase change material memory element.

2. Background Description

Solid state, phase change materials that are chalcogen (Group VI elements such as sulfur (S), selenium (Se) and tellurium (Te)) alloys with at least one of germanium (Ge), arsenic (As), silicon (Si), and antimony (Sb) are known as chalcogenides and are well known. Chalcogenides exist in at least two different classifiable solid states or phases. The most extreme two states can be classified simply as amorphous and crystalline states with other less easily discernable states ranging between those two states. The amorphous state has a disordered atomic structure and the crystalline state generally is polycrystalline. Each phase has very different electrical properties. In its amorphous state, the material behaves as an insulator, i.e., an open circuit; in its crystalline state, the same material behaves resistively. The resistivity of these materials varies in between amorphous and crystalline states by as much as 6 orders of magnitude.

In particular, when heat is applied to some phase change chalcogenides, the material switches phases from one (e.g., amorphous phase) state to a second (e.g., crystalline phase) state. The transitions between these states is selectively reversible with heat, i.e., the phase change material may be set/reset. As with anything that has two or more discernable and selectable states, each of the 2 stable states can be designated as a logic one and the other a logic zero. Thus, phase change material has found use in storage devices and particularly, for non-volatile storage, e.g., as a memory cell storage media. In addition, multiple bit memory elements have been made using the intermediate states inherent in the variation in resistivity between amorphous and crystalline.

Typically, controlled heat must be precisely provided to the phase change storage media to effect reversible transitions between amorphous and crystalline states and back. Normally, such heat is provided using resistive heating. Unfortunately, a relatively of large current is needed for each memory element to heat the phase change material. In particular, resetting the phase change material may require heating the crystalline material to its melting point, generally above 600° C. Thus, it maybe difficult on one hand to provide sufficient localized heat to raise the crystalline phase change material to its melting point and, on the other hand, to avoid accidentally heating other adjacent cells to the phase change set point and inadvertently setting adjacent cells.

One prior approach to localize heating in phase change switching is to minimize the phase change material contact area. Unfortunately, reducing the contact area normally increases cost, which is inversely proportional to the size of the contact. In particular, attaining a contact size below the minimum photolithographic image size for a particular technology complicates the process significantly and, correspondingly, increases cost. Further, normally, reducing contact size, reduces the heat delivery capability and increases resistance/reduces current delivered to the phase change material; all of which interferes with setting/resetting the material rather than enhancing it.

Thus, there is a need for improved and very localized or focused heat delivery to phase change material in memory cells.

SUMMARY OF THE INVENTION

It is a purpose of the invention to improve heat delivery to phase change material in memory cells;

It is another purpose of the invention to focus heat delivered to phase change material in individual memory cells;

It is yet another purpose of the invention to reduce the power required to deliver sufficient heat to set and reset phase change material in individual memory cells.

The present invention relates to a stylus, an integrated circuit (IC) and method of forming the IC. The stylus extends upward from its apex and has a substantially circular cross section that decreases in diameter upward from the apex. The stylus is formed in a mold that may be formed in an orifice in a dielectric layer between wiring layers. The mold may include multiple concentric layers. For a more pronounced, non-linear stylus taper, each layer may be thinner than its next adjacent outer concentric layer.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
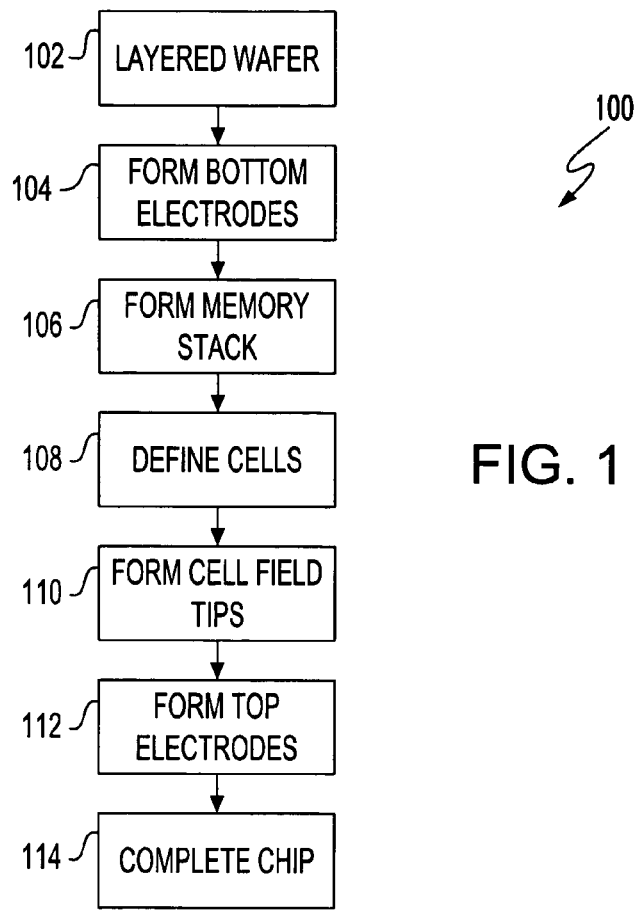
FIG. 1 shows a flow diagram for an example of a method of forming a preferred embodiment cross point array of non-volatile storage devices.

Turning now to the drawings and more particularly FIG. 1 shows a flow diagram for an example of a method 100 of forming preferred embodiment nonvolatile storage devices according to the present invention, e.g., in a cross point storage array. In particular, preferred embodiment devices have chalcogenide phase change storage media, switched diodes with a focused heating field for enhanced Joule heating power delivery that improves phase change alteration. Preferably, Joule heating delivery is enhanced by delivering heat through a tip or apex of the stylus at the phase change material, focusing heat much like a sub-micron soldering pencil. In particular during a write, the hottest stylus region is spaced away from the bulk of the stylus and at the apex and so, contained entirely within the phase change material.

Cell formation begins in step 102 with a layered wafer. In particular, the layered wafer may be a partially patterned integrated circuit with standard insulated gate field effect transistor (FET) technology circuit devices, commonly referred to as CMOS. Memory cells are formed as described hereinbelow between 2 conductor layers, referred to as top and bottom electrode layers. Further, circuit devices, both N-type FETs (NFETs) and P-type FETs (PFETs), may be connected together by wiring that may be, in part, on one or both of the 2 conductor layers. So, in step 104 bottom electrodes are formed in a conductor layer at the surface of the layered wafer. Then in step 106, a number of layers are formed in a stack on the bottom electrodes. In step 108 the stack is patterned to define cells, leaving pillars of stacked layers in cell locations where cells will be formed. A protective fill is deposited and in step 110 a field tip or stylus is formed in each of the cell locations. The preferred stylus or field tip points down into the wafer and toward the bottom electrodes. Then in step 112, the array is completed when top electrodes are formed over the cells. By orienting the bottom electrodes in one direction and the top electrodes in a second, each cell is uniquely identifiable by the intersection of one bottom electrode with one top electrode. Finally in step 114, using standard semiconductor manufacturing back end of the line (BEOL) steps, the memory (macro, chip, etc.) is completed.

It should be noted that heretofore, stylus shaped field tips have been formed using a hard mask and a wet etch to define tips upstanding like stalagmites, standing on and pointing upward from the wafer. By contrast, a preferred embodiment stylus shaped field tip is formed inverted from these stalagmite shaped styli, i.e., effectively standing on the stylus apex. Further, although described herein with reference to memory cells, these preferred embodiment styli have application beyond memory cells. For example, such a stylus has application to micro-electro-mechanical structures (MEMS) and atomic force microscopy (AFM). Further such a stylus has application to providing heretofore unavailable precision for current localization in integrated circuits.

Figure 2:
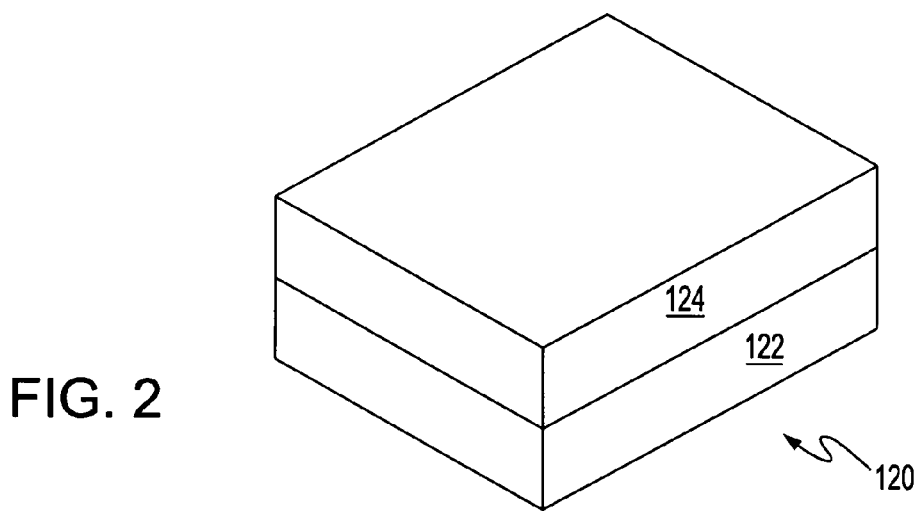
FIG. 2 shows a plan view of a three dimensional (3D) cross sectional view of a layered wafer.

FIG. 2 shows a plan view of a three dimensional (3D) cross sectional view of a layered wafer 120 provided in step 102. The layered wafer 120 in this example includes an interlevel dielectric 122 capped with an intralevel dielectric 124. Preferably, the interlevel dielectric layer 122 includes 2 sub-layers formed on a standard CMOS circuit wafer. In particular, the preferred interlevel dielectric layer 122 is a 500 nm thick silicon oxide capped with a 50 nm thick etch/polish stop and barrier, e.g., silicon nitride or silicon carbide. The interlevel dielectric layer 122 may be formed, for example, using plasma enhanced chemical vapor deposition (PECVD) to deposit both a PECVD oxide and the silicon nitride or silicon carbide etch/polish stop barrier. The intralevel dielectric layer 124 is substantially the same as the interlevel dielectric layer 122 except, it may be thinner, i.e., the intralevel dielectric layer 124 may be a 300 nm thick silicon oxide capped with a 50 nm thick etch/polish stop and barrier.

Figure 3A:
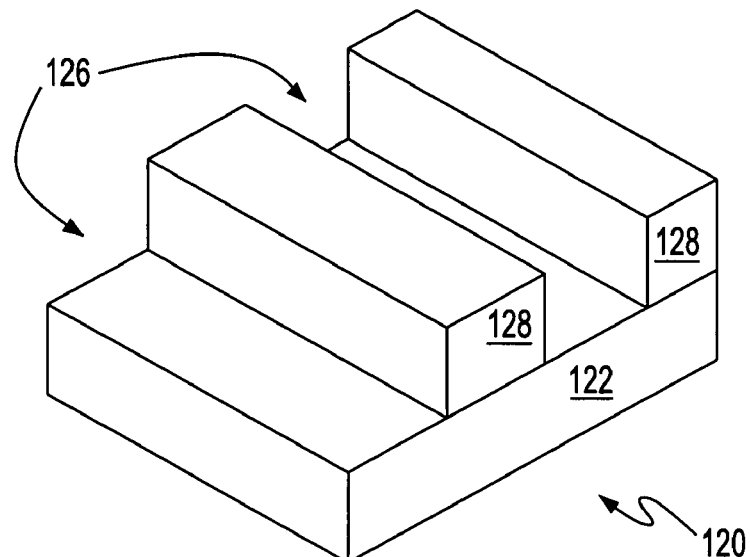
FIGS. 3A-B show an example of bottom electrode formation.
Figure 3B:
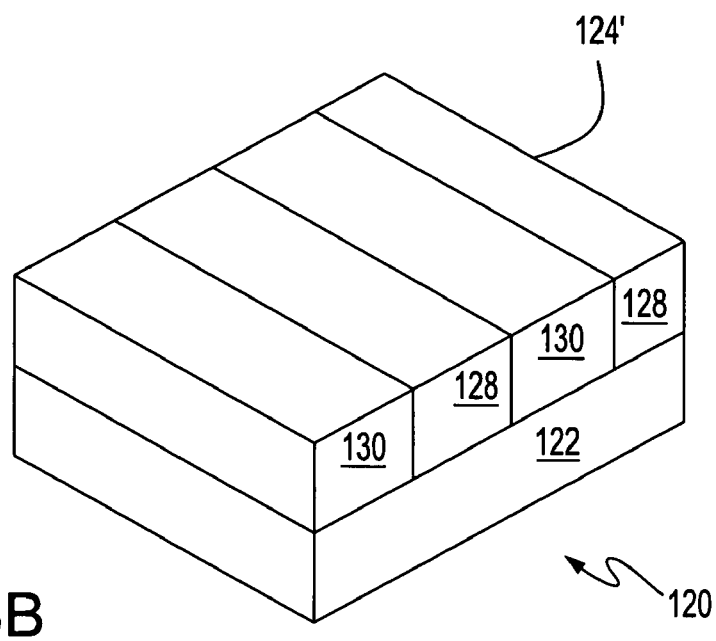

FIGS. 3A-B show an example of the bottom electrode formation step 114 in FIG. 1. FIG. 3A shows the bottom electrode pattern formed in the intralevel dielectric layer 124. A mask layer (not shown) is formed on the intralevel dielectric layer 124. Then, using typical patterning techniques, e.g., photolithographically or with nano imprint technology, the bottom conductor pattern is imprinted in the mask layer and the mask layer is developed, re-exposing portions of the intralevel dielectric layer 124. Then, the exposed portions of the intralevel dielectric layer 124 are removed, e.g., using a reactive-ion-etch (RIE) to etch to the interlevel dielectric layer 122, thereby imprinting the bottom electrode pattern on the intralevel dielectric layer 124 and form trenches 126 separated by remaining intralevel dielectric material spacers 128. Then, in FIG. 3B, bottom electrode conductors 130 are formed. In particular, the bottom electrodes 130 are formed by first forming a conductive layer, such as doped amorphous silicon (a-Si) or, a layered metal such as tungsten or copper on an underlying barrier. For example, a suitable layered metal may be formed by depositing 500 nm of copper on a 10 nm barrier metal layer, such as Titanium Nitride (TiN). Then, the wafer is planarized using a typical chemical mechanical polish (CMP), for example, to remove the metal above spacers 128, leaving only electrodes 130 separated by spacers 128 in bottom electrode layer 124'. Optionally, if a-Si is used to form the bottom electrodes 130, a low temperatures salicide (e.g., NiSi) may be formed on the a-Si bottom electrodes 130 for improved conductivity and facilitate converting the a-Si to the polycrystalline silicon or polysilicon conductors.

Figure 4A:
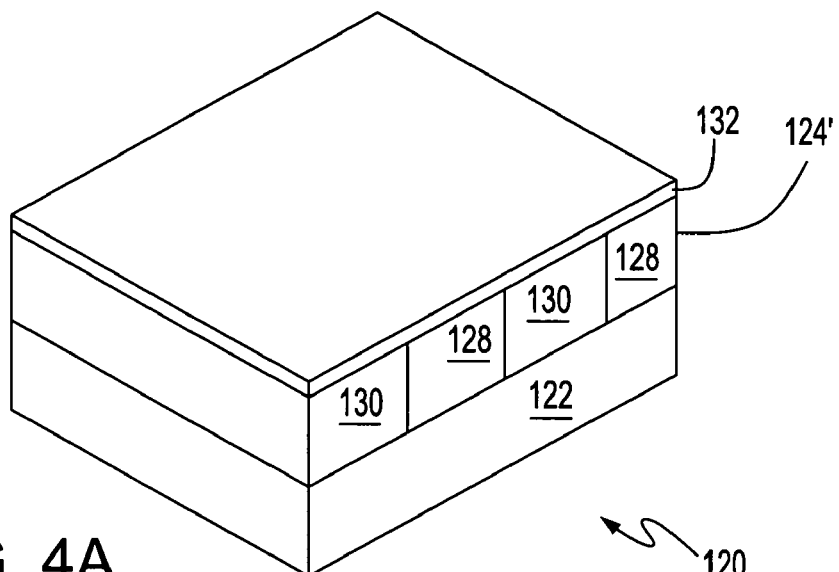
FIGS. 4A-D show an example of memory stack formation.
Figure 4B:
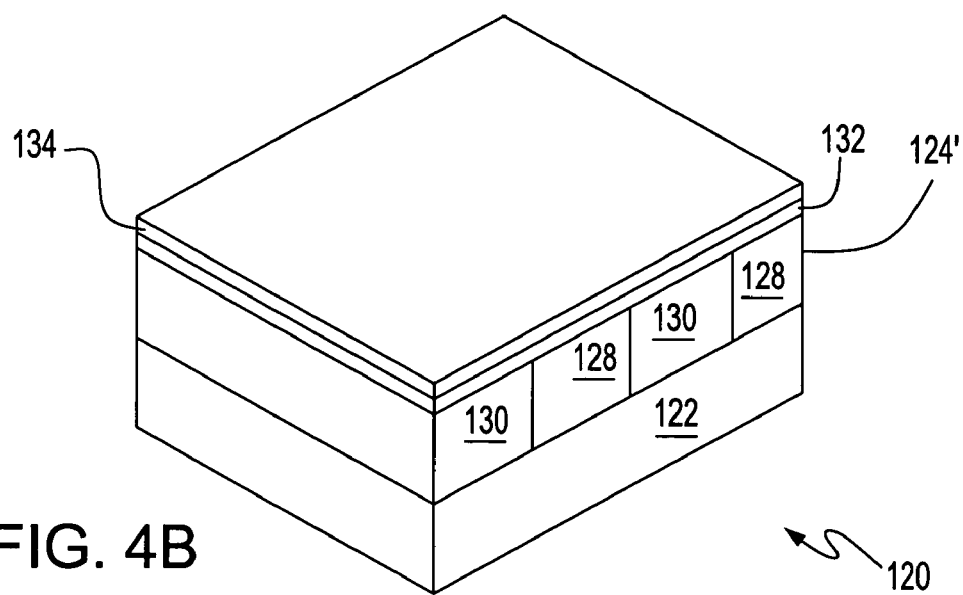
Figure 4C:
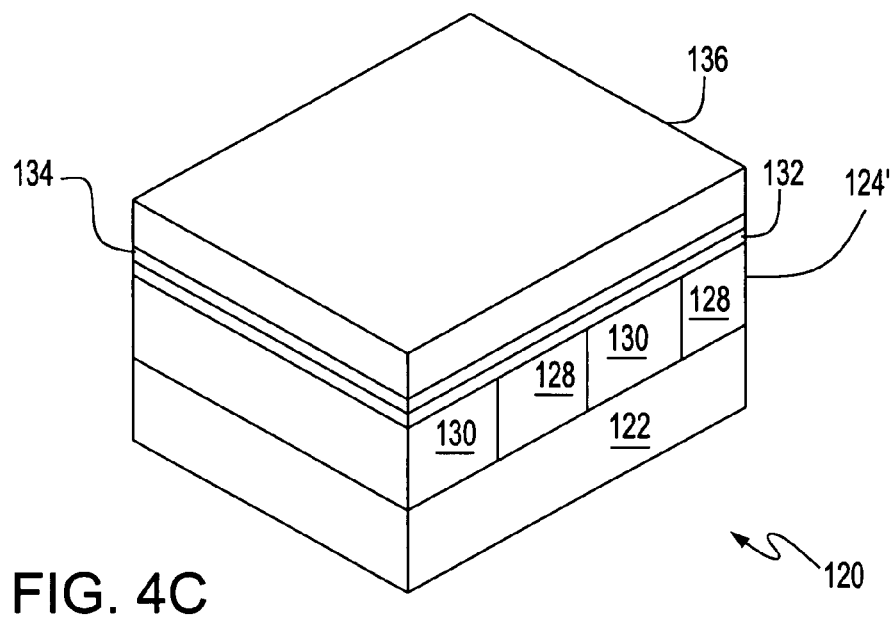
Figure 4D:
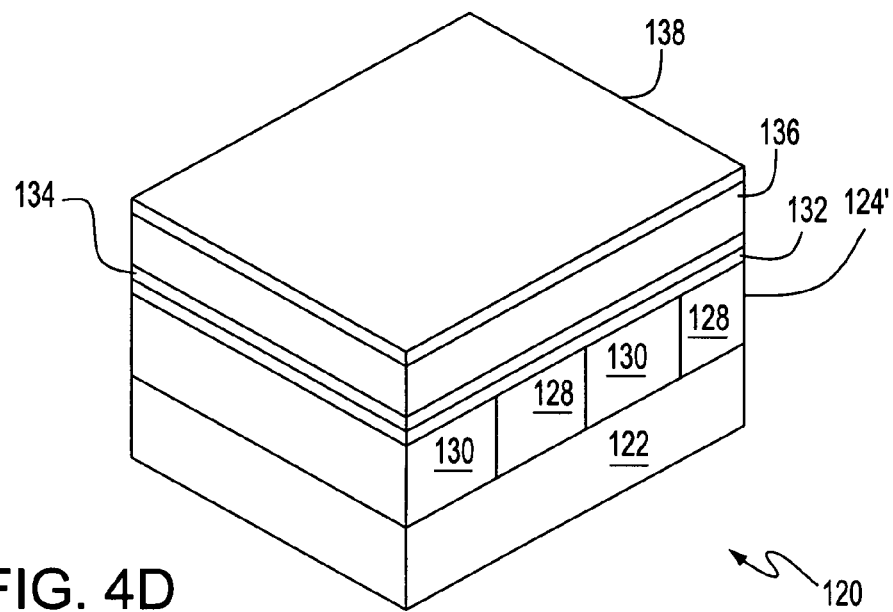

FIGS. 4A-B show an example of the memory stack formation step 106 of FIG. 1. First about a 5-50 nm thick layer 132 of a conductive barrier material (e.g., TiN), preferably, 25 nm thick, is deposited on the bottom electrode layer 124'. Next a memory media layer 134 of a suitable phase change material, no thicker than about 50 nm thick, is deposited on the conductive barrier layer 132. Preferably, the phase change media layer 134 is a layer of a suitable chalcogenide and, in particular, a dual phase chalcogenide, such as a germanium, antimony, tellurium based material (e.g., $Ge_2Sb_2Te_5$), referred to herein as GST. Then, a sacrificial amorphous silicon layer 136 is deposited on the phase change media layer 134. Preferably, the sacrificial amorphous silicon layer 136 is no thicker than about 250 nm thick for a 125 nm diameter memory cell on a 250 nm pitch. Finally, about a 5-50 nm thick pad nitride layer 138 is deposited on the sacrificial amorphous silicon layer 136. Optionally a thin etch stop/barrier film (not shown) may be included between the phase change media layer 134 and the sacrificial a-Si layer 136.

Figure 5A:
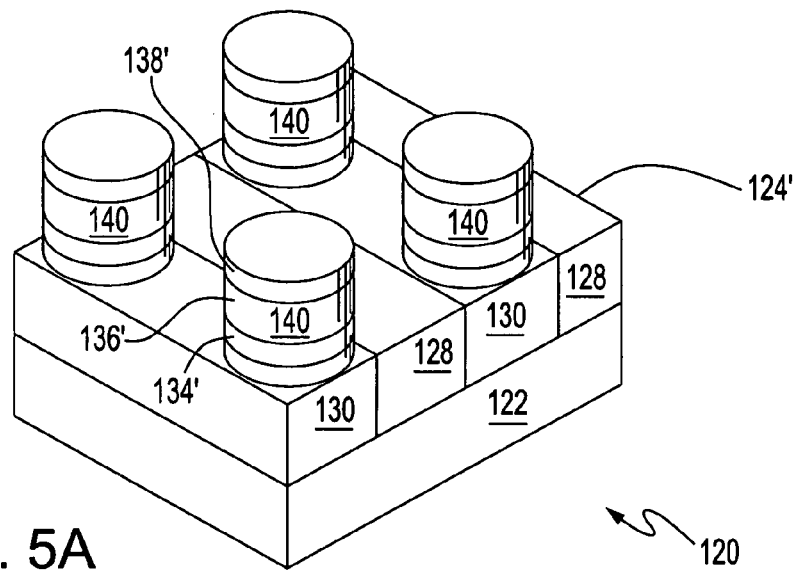
FIGS. 5A-B show the step of defining cells.
Figure 5B:
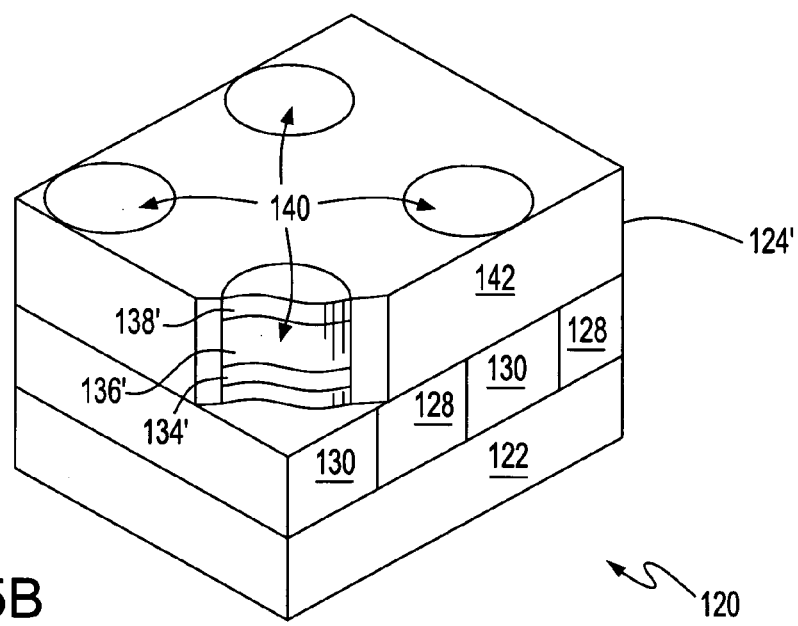

FIGS. 5A-B show the step of defining cells 108 in FIG. 1. First, a mask (not shown) is formed, photolithographically or, using nano imprint technology, to define the memory cell locations 140. Then, using a typical etch, e.g., RIE and/or a timed etch, the memory stack layers are etched selectively to remove the memory stack layers between the memory cell locations 140 to result in the structure of FIG. 5A. A dielectric field layer 142 is deposited. Preferably, the field layer 142 is a 500 nm thick overfill layer for a 325 nm thick stack on a 250 nm pitch to facilitate CMP over dense (array) and sparse (non-array) regions. Then, the field layer 142 is stripped back and planarized, using CMP for example, stopping at the pad nitride layer 138' in the memory cell locations 140.

Figure 6A:
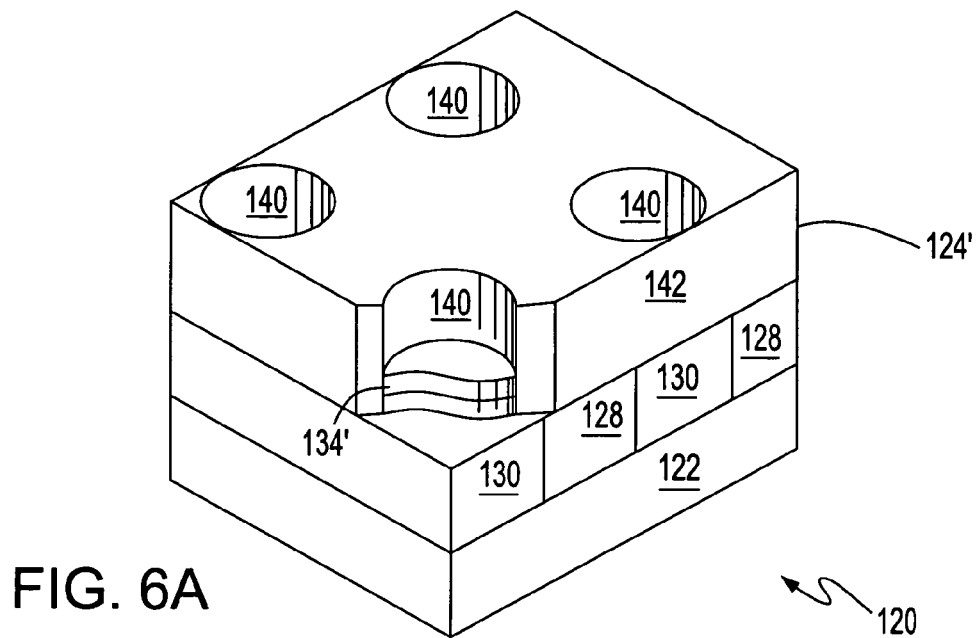
FIGS. 6A-F show a first example of forming cell field tips.
Figure 6B:
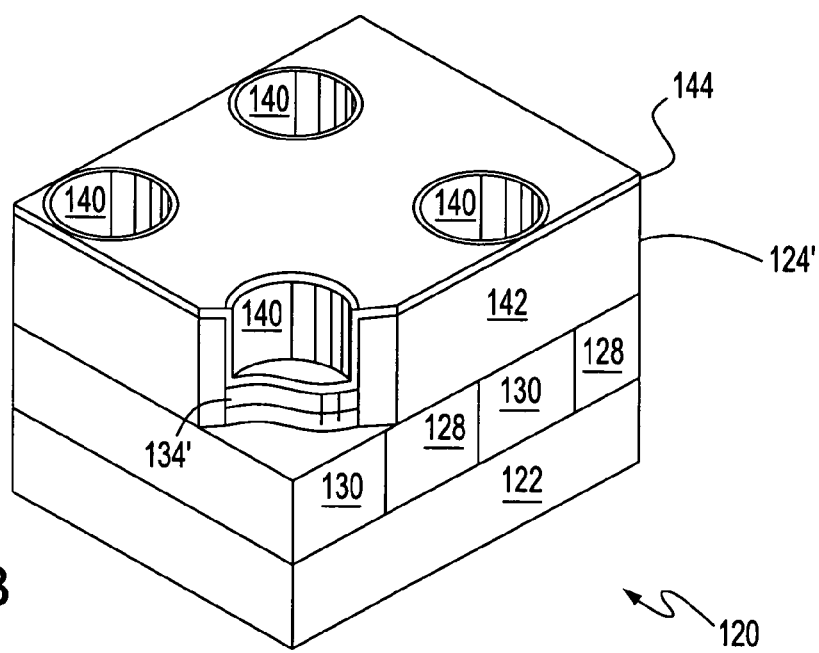
Figure 6C:
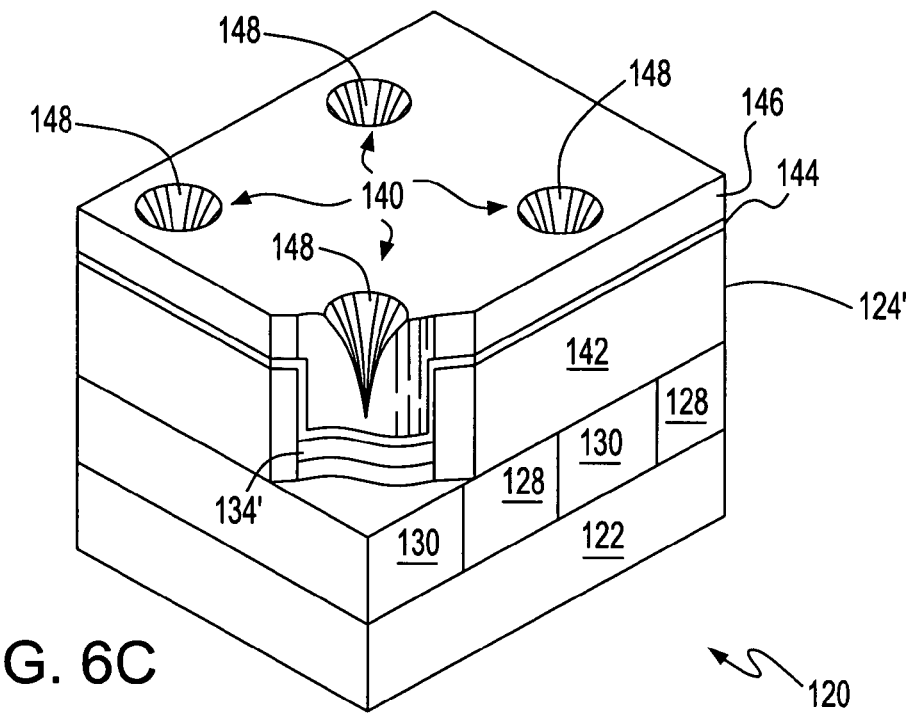

FIGS. 6A-F show a first example of forming cell field tips in step 110 of FIG. 1. First, the remaining portions of the (50 nm thick) pad nitride layer 138' are removed from the memory cell locations 140, e.g., using hot phosphoric acid. Then, a wet etch (e.g., Potassium hydroxide (KOH)) may be used to strip away the (200 nm thick) sacrificial amorphous silicon 136' opening about a 250 nm deep orifice at each memory cell location 140 as shown in FIG. 6A. Preferably, the wet etch is selective to amorphous silicon, stopping on the phase change media layer 134'. Next, in FIG. 6B a liner 144, preferably a 15 nm thick silicon nitride (SiN) layer, is conformally deposited on the surface. Then, a single spacer layer 146 is deposited for this embodiment as shown in FIG. 6C, partially filling the 250 nm deep orifice at each memory cell location 140, such that conically shaped dimples 148 form. Preferably, the spacer layer 146 is an oxide (e.g., silicon oxide ($SiO_2$)) layer with a thickness less than half the memory cell diameter, e.g., less than 62 nm for a 125 nm memory cell diameter, to avoid closing the conical dimples 148. As the conformal spacer layer 146 grows in the memory cell location 140, the layer is slightly thicker at the inside corner at the bottom of the orifice than at outside corner at the top, providing an incline to the layer along the orifice sidewall.

Figure 6D:
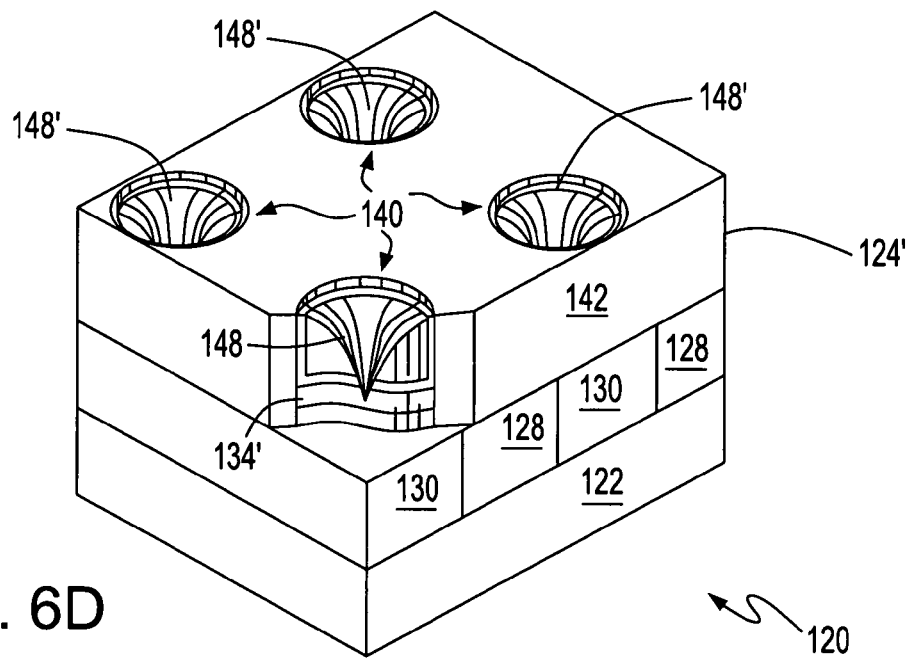
Figure 6E:
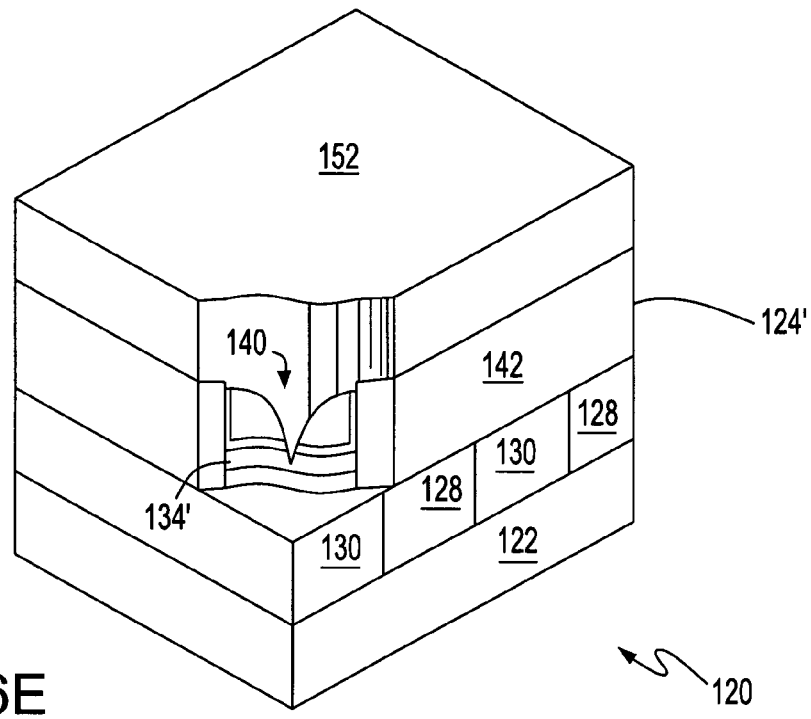
Figure 6F:
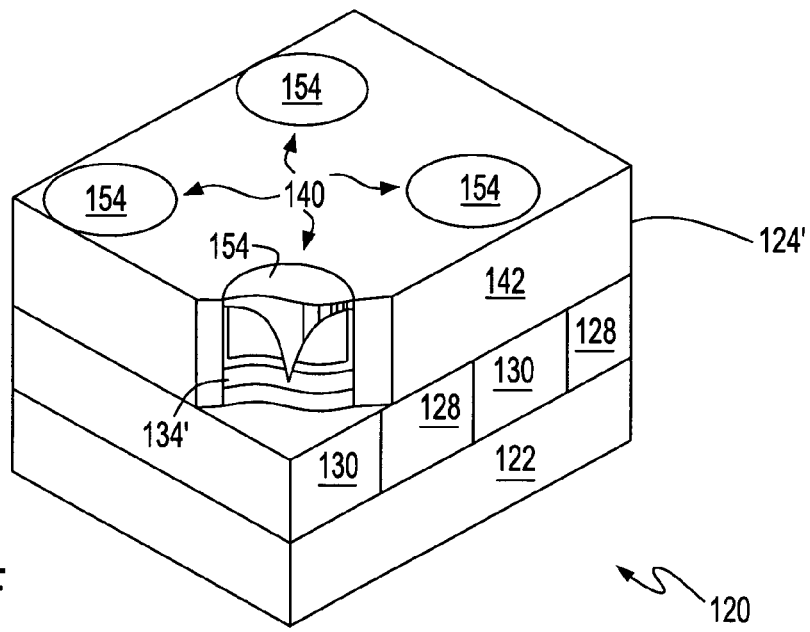

Continuing to FIG. 6D, the spacer layer 146 is directionally etched, e.g., again using RIE, to maintain the vertical profile of the layer in each cell (i.e., the conical shape), while removing the horizontal portions. Preferably, the RIE etchant is selective to the spacer layer 146 and etching continues until horizontal portions of the nitride layer 144 are re-exposed. Then, the re-exposed horizontal portions of the nitride layer 144 are etched, e.g., using a RIE, and with an endpoint for this etchant being determined by removal of the nitride layer 144 or encroachment into the GST 134' in the stacks. Preferably, the encroachment is to a target depth of about 15 nm and no more than about 20 nm into the GST 134'. Thus, the remaining spacer layer sidewall spacers form a conical mold 148' for each field tip in each cell. The surface is cleaned using a dry clean, e.g., ozone ($O_3$) and a field tip layer 152 is deposited as shown in FIG. 6E. Preferably, the field tip layer 152 is an amorphous silicon layer on TiN or TaN. For optionally threshold tailoring, the finally formed cell diode may include an insulator or semiconductor with a wide band gap voltage (e.g., a thin $SiO_2$ or SiC layer wrapped around the tip) may also be used. Finally, in FIG. 6F the field tips 154 are defined at each cell using CMP to remove the horizontal portions of the field tip layer 152, for example. Thus, for CMP an amorphous silicon field tip layer 152 may be used to remove the horizontal portions, stopping on dielectric field layer 142. Optionally, to provide a better upper electrode contact, a thin nickel layer, e.g., 10 nm thick, may be deposited on the amorphous silicon field tips 154 and a low-temperature metal induced crystallization may be effected. Remaining nickel is stripped away post crystallization.

Figure 7A:
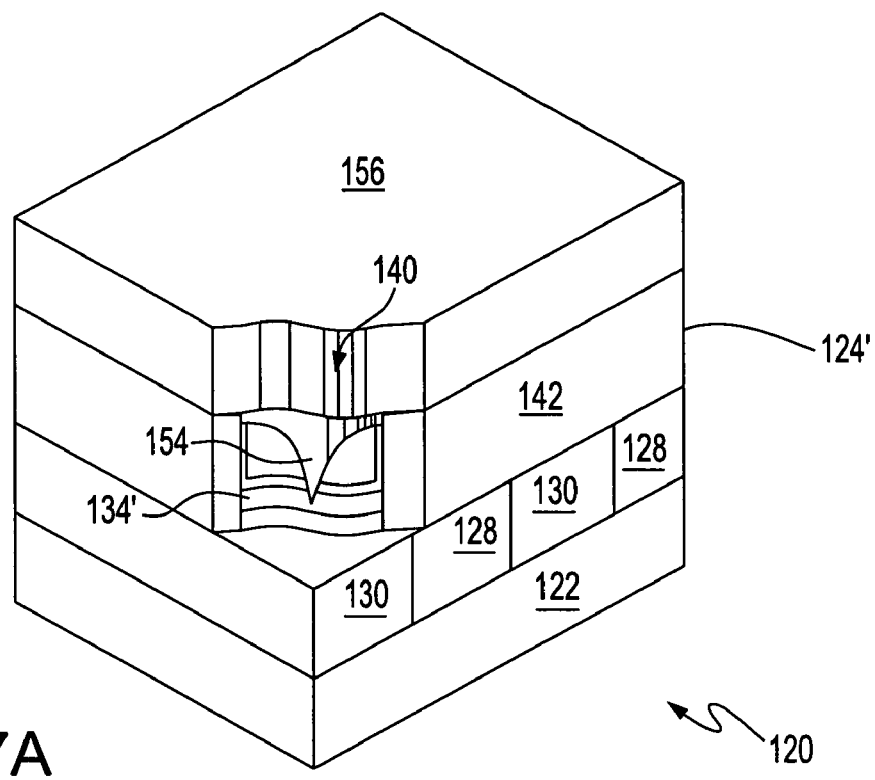
FIG. 7A-C shows formation of top electrodes
Figure 7B:
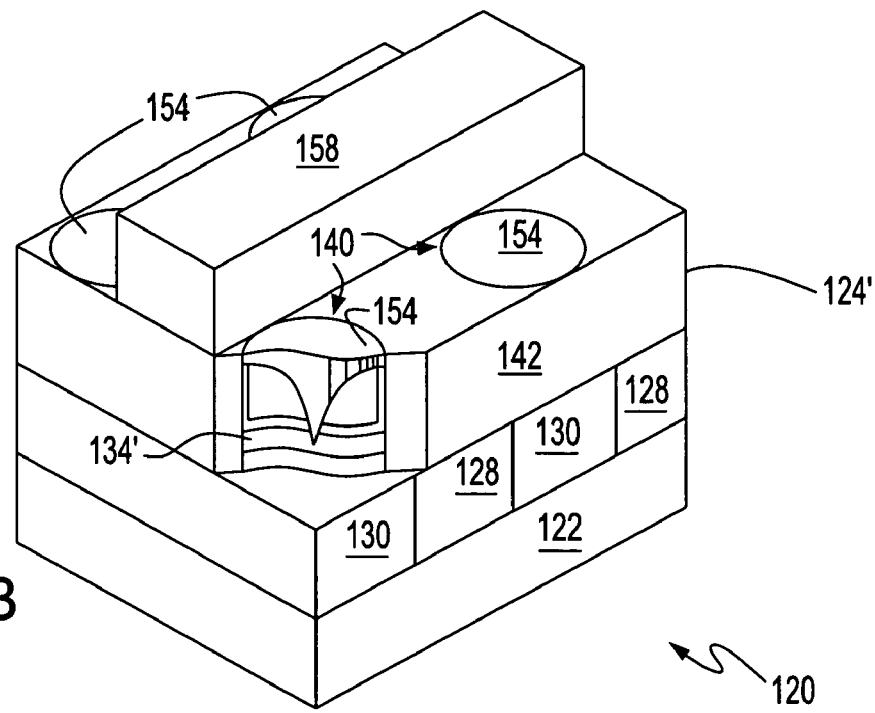
Figure 7C:
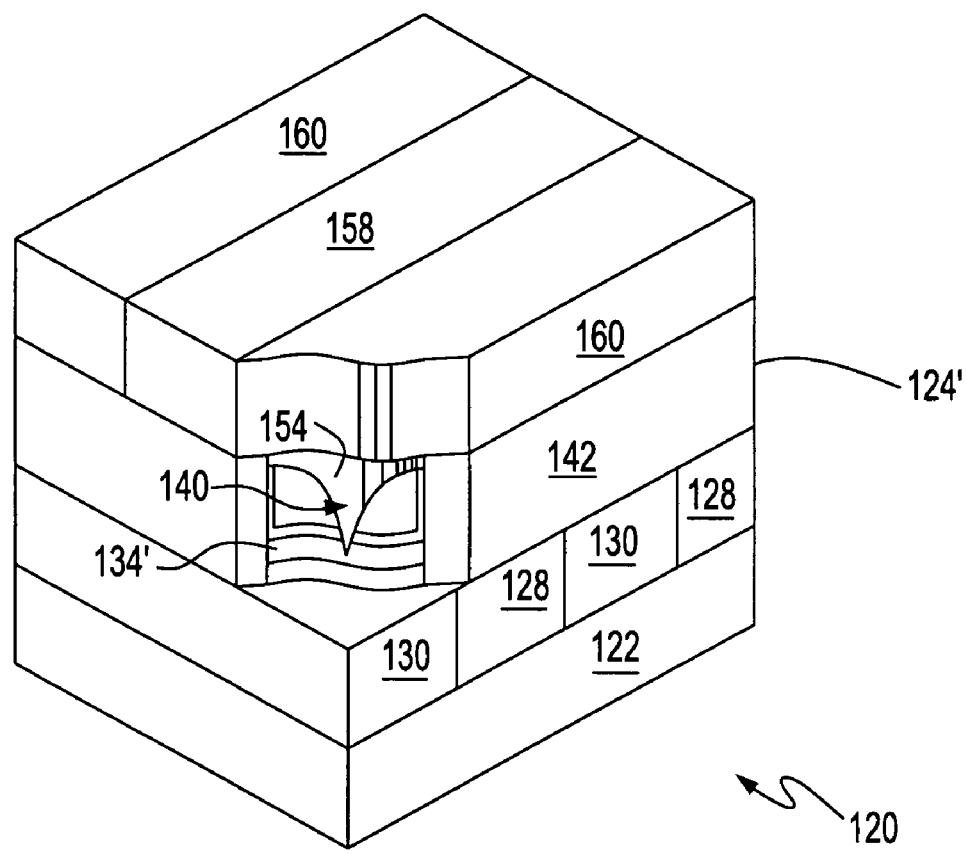

FIG. 7A-C shows formation of top electrodes in step 112 of FIG. 1, formed substantially similarly to forming bottom electrodes in step 104. First, in FIG. 7A a 500 nm thick layer of an intralevel dielectric 156 is deposited. Then, a mask (not shown) is formed, e.g., photolithographically or using nano imprint technology on the intralevel dielectric layer 156.

Then, in FIG. 7B portions of the intralevel dielectric layer 156 are removed to re-expose the upper surface of the field tips 154. The intralevel dielectric may be removed using a RIE substantially as described hereinabove for the bottom electrodes. Preferably, intralevel dielectric layer 156 is nitride such that a RIE selective to the nitride is used to etch the nitride layer 156 and stopping on the dielectric field layer 142. Remaining portions 158 of the intralevel dielectric layer 156 form a mask for the top electrodes. Then, a top conductor layer (not shown) is deposited on the wafer and CMP is used to remove excess top conductor layer, which isolates and defines the top electrodes 160 as shown in FIG. 7C. Preferably, the top conductor layer is a 500 nm thick metal layer on a 10 nm thick barrier metal, e.g., tungsten or copper on a barrier layer. Alternately, the top conductor layer may be a 500 nm thick doped amorphous silicon layer. Thus having been defined the top electrodes 160, individual cells may be accessed by intersection of the top electrodes 160 with the bottom electrodes 130 at a cell, i.e., at a cross point between top electrodes 160 and bottom electrodes 130. Once having form the top electrodes 160, the chip can be completed using typical back end of the line (BEOL) steps to form wiring connections to the top electrodes to other chip circuits and, off chip.

Figure 8A:
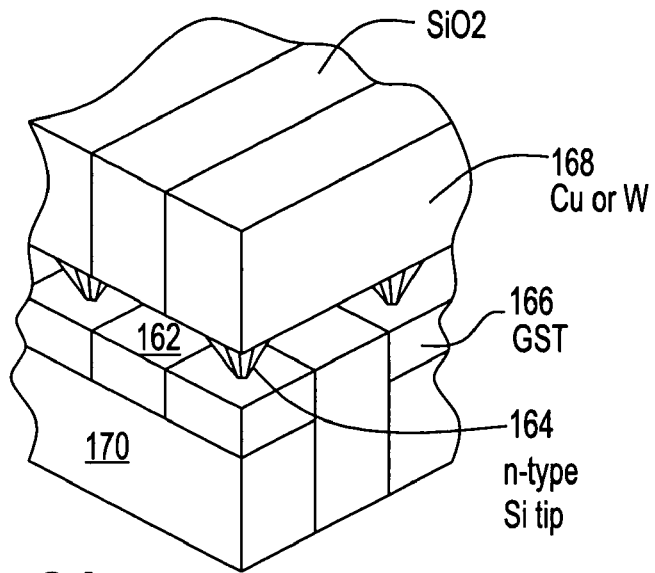
FIGS. 8A-B show a cross section of a completed cell.
Figure 8B:
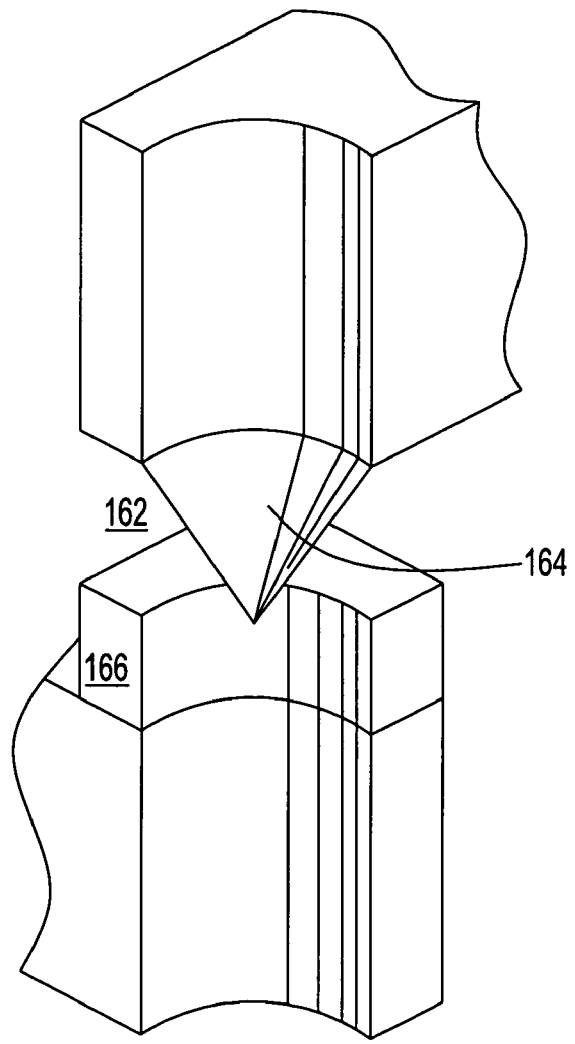
Figure 8C:
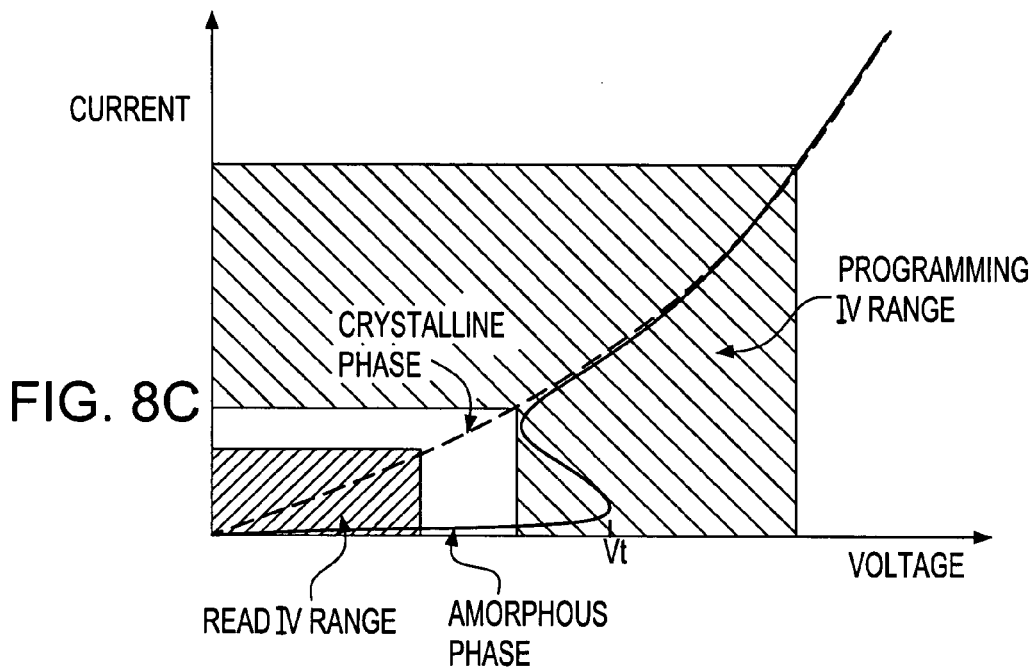
FIG. 8C shows an example of a current verses voltage (I-V) characteristic for a typical chalcogenide suitable as a phase change memory material for preferred embodiment cross point cells.
Figure 8D:
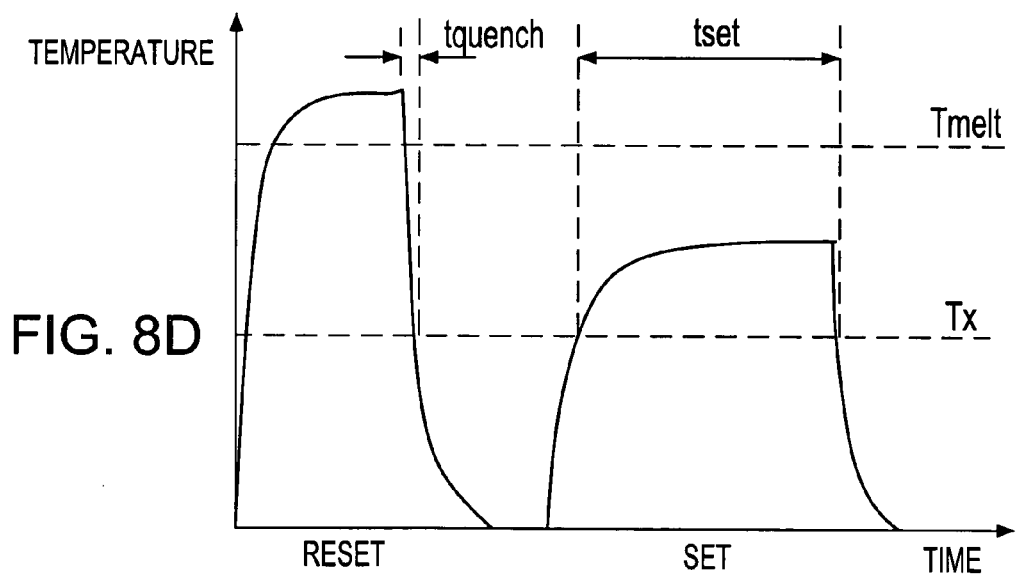
FIG. 8D shows an example of typical chalcogenide memory programming temperature evolution profiles for preferred embodiment cross point cells.

FIG. 8A show a cross section of a completed cell 162 with oxide 142 stripped away and FIG. 8B shows a corresponding blowup of the cross-section of cell 162. As noted hereinabove, the tip 164 slightly penetrates the GST layer 166. FIG. 8C shows an example of a current verses voltage (I-V) characteristic in amorphous and crystalline phases for a typical chalcogenide suitable as a phase change memory material for preferred embodiment cross point cells. FIG. 8D shows an example of typical chalcogenide memory programming temperature evolution profiles for preferred embodiment cross point cells. Switching states is effected by Joule heating the cell GST in layer 166 to switch phases: switching to its amorphous (RESET) phase by heating the GST to $T_{melt}$ and allowing it sufficient time to cool ($t_{quench}$); and, alternately, crystallizing (SET) the GST by heating it to $T_x$ and allowing it sufficient time to cool ($t_{set}$). Thus, by switching the GST at the tip between crystalline and amorphous phase and back the cell switches from having a resistor with enhanced current/voltage characteristics (i.e., when the top electrode is negative with respect to the bottom electrode) to a cell that is open between the top electrode 168 and bottom electrode 170 and back. So, for example, amorphous GST may be a logic zero and crystalline GST may be a logic one.

Figure 9A:
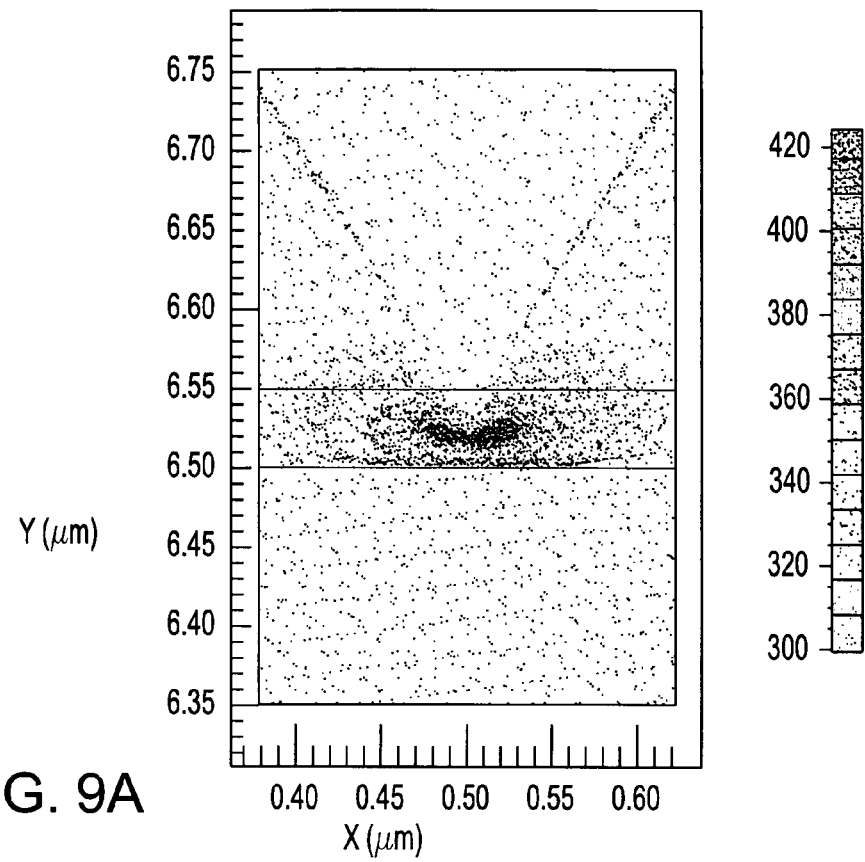
FIG. 9A shows a 2 dimensional (2D) cross-section of Joule heating at the cell field tip.
Figure 9B:
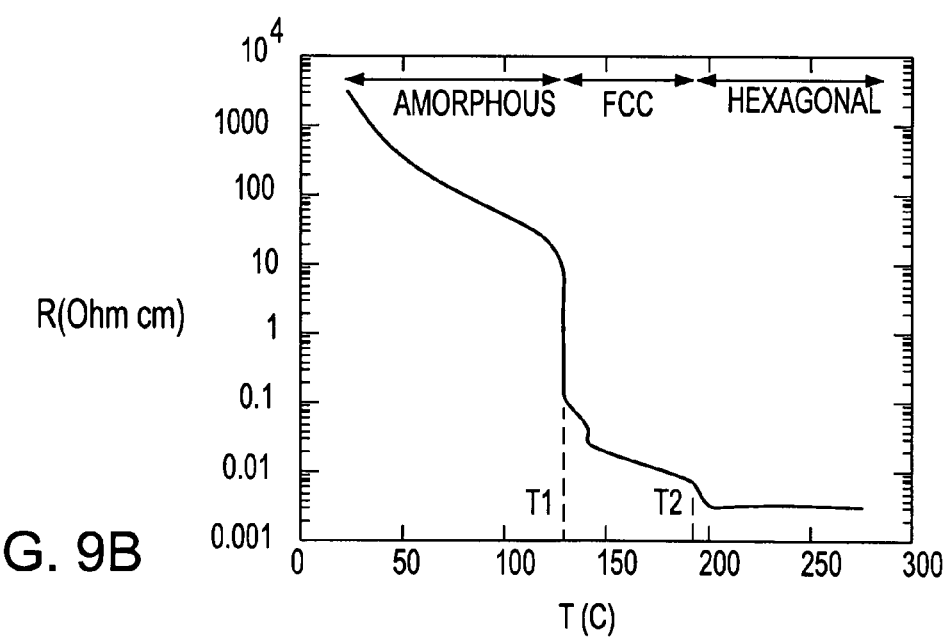
FIG. 9B shows an example of chalcogenide memory material and, in particular GST, resistance range with temperature and characterized by phase.

FIG. 9A shows a 2 dimensional (2D) cross-section of Joule heating at the cell field tip, e.g., 162 in FIGS. 8A-B. FIG. 9B shows an example of chalcogenide memory material and, in particular GST, resistance range with temperature and characterized by phase, i.e., amorphous, FCC and hexagonal. As indicated by FIG. 9A, the hottest region is slightly spaced away from the apex of the field tip stylus. Further the apex is entirely in the GST so that the GST at the interface with the silicon tip stays in this crystalline phase by design. This improves the ability to cycle and recycle the GST memory element and increases the upper limit on the number of times that the element may be cycled, i.e., the number of times that the element can be written. Since end of life for a memory element is defined, at least in part, by when cells can no longer be written, the present invention has extended cell and chip end of life.

Figure 10:
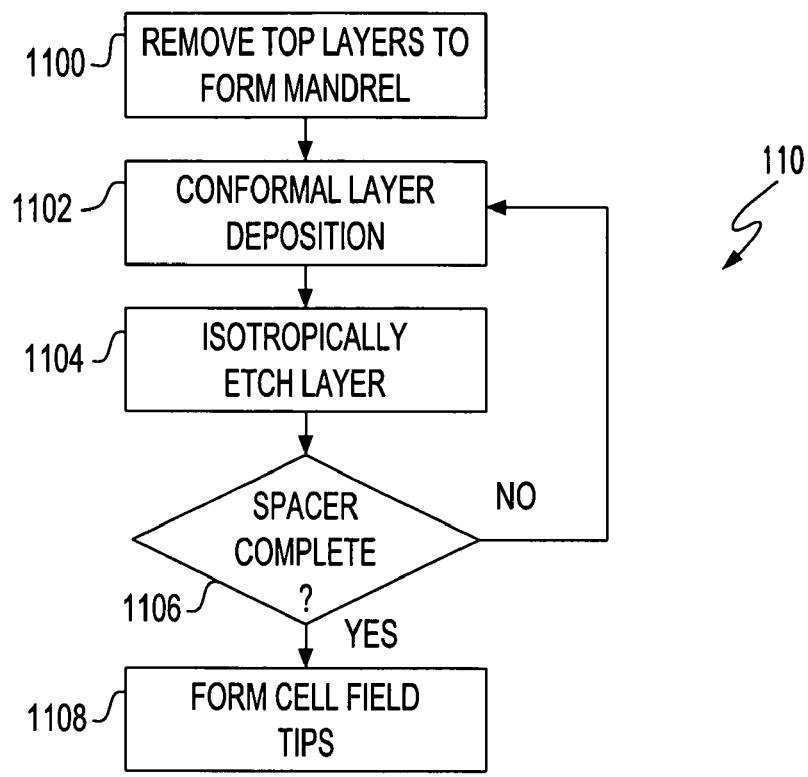
FIG. 10 shows another preferred method of forming stylus shaped field tip with a more pronounced tapered depression mold.

FIG. 10 shows another preferred method of forming stylus shaped field tip with a more pronounced tapered depression mold and avoiding the single layer potential for plugging the orifices, rather than forming the tip mold, as described hereinabove. Again it should be noted that although described in terms of forming field tips for cells step 110, field tips as described herein have much wider application. Thus, each such field tip may be formed in such an orifice (e.g., cell location 140) regardless of whether memory stack layers are previously formed. Primarily, in this preferred embodiment, instead of depositing a single conformal dielectric layer (146 in FIG. 6C), the tip mold is formed by depositing successive dielectric layers and isotropically etching to remove horizontal portions of each. So, continuing the cross point cell example in step 1100 after removing the upper layers 136 and 138 in memory cell locations (see, e.g., FIG. 6A). For a memory cell a liner, e.g., nitride liner 144 in FIG. 6B and not shown in this example) may be deposited. Further, although in this example an orifice, preferably, cylindrically shaped, is opened, e.g., through to the phase change layer. Then, in step 1102 a first conformal spacer layer is deposited. In particular, the conformal spacer layers may be silicon nitride (e.g., $Si_3N_4$) or oxide. Silicon nitride can be deposited with a mixture of ammonia and silicon hydride using plasma enhanced chemical vapor deposition (PECVD) or in a furnace reactor at a pressure of between 10 milliTorr (10 mTorr) and 1 Torr. Deposition thickness can be time controlled. Alternately, oxide can be deposited by flowing ozone and tetraethylorthosilicate (TEOS) into a deposition reactor. Preferably, the wafer temperature in such deposition is between 300° and 500° C. and under a pressure between 10 and 400 mTorr. Again, deposition thickness is time controlled. Next, in step 1104 the layers are isotropically etched, preferably with a plasma etch, to remove horizontal surfaces of the conformal layer, which also slightly reduces the height of the vertical sidewall spacer that remains in the orifice. If additional layers are to be deposited in step 1106, then returning to step 1102 the next conformal layer is deposited and etched in step 1104. The layered spacers form a mold in the orifice for the preferred spacer size and the tip material is deposited in step 1108 as described hereinabove.

Figure 11:
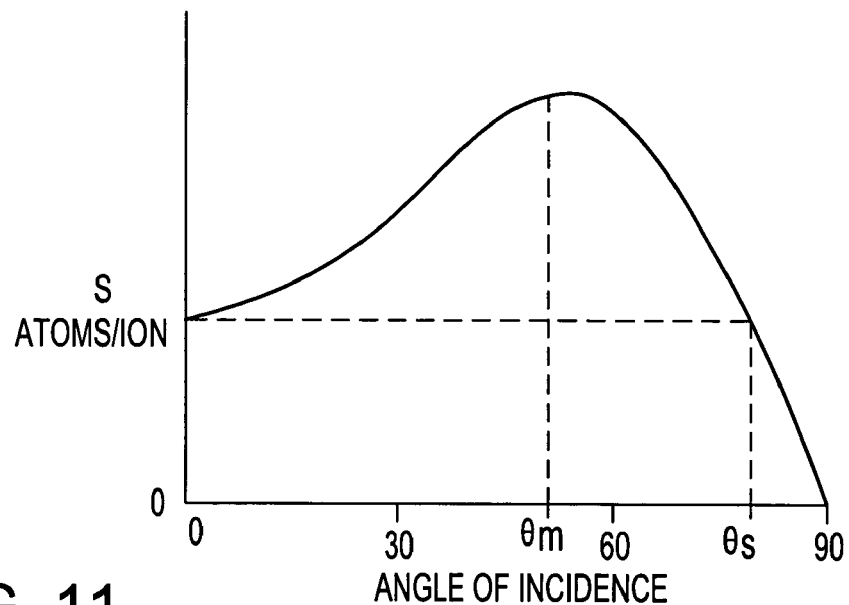
FIG. 11 shows plasma etch sputtering yield with respect to target normal.

FIG. 11 shows plasma etch sputtering yield with respect to target normal, which shows that enhancing sputtering enhances preferential erosion of horizontal layers with a maximum occurring at a sputtering angle ($\theta_m$) of about 50° across an angular range of 0 to an upper angular limit ($\theta_s$) of about 80°. So, if in step 1104 the isotropic etch does not have a sputtering component, the curvature of the deposited conformal film normally would translate to the spacer. However, enhanced sputtering enhances preferential plasma erosion of the horizontal portions of the conformal layer for a more pronounced sidewall curvature. The more pronounced the sidewall curvature, the more pronounced the tip mold and the tip itself. So, to enhance sputtering during the plasma etch, the wafer is biased (either with a self bias or using an appropriate external DC bias) with respect to plasma. In particular, the conformal layer may be etched in step 1104 in a plasma reactor at pressures between about 1 and 250 mTorr using a fluorinated plasma, e.g., using feed gasses such as $CHF_3$, $CF_4$ and/or $O_2C_2F_6$.

Figure 12A:
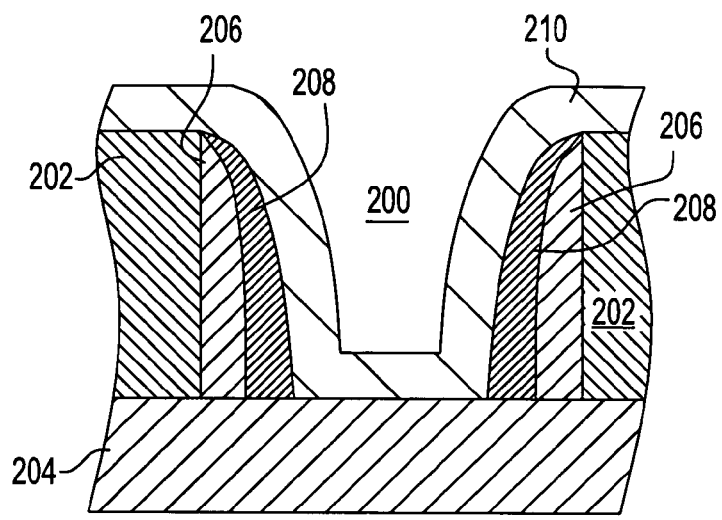
FIGS. 12A-E show an example of forming a stylus according to the preferred method of FIG. 10.
Figure 12B:
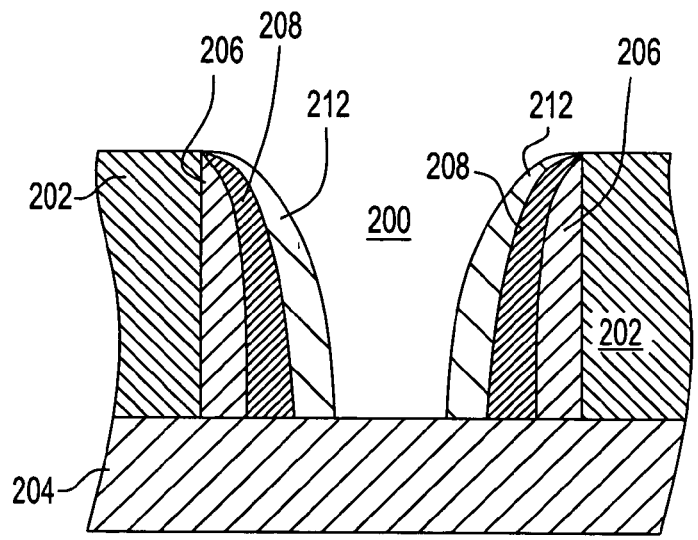
Figure 12C:
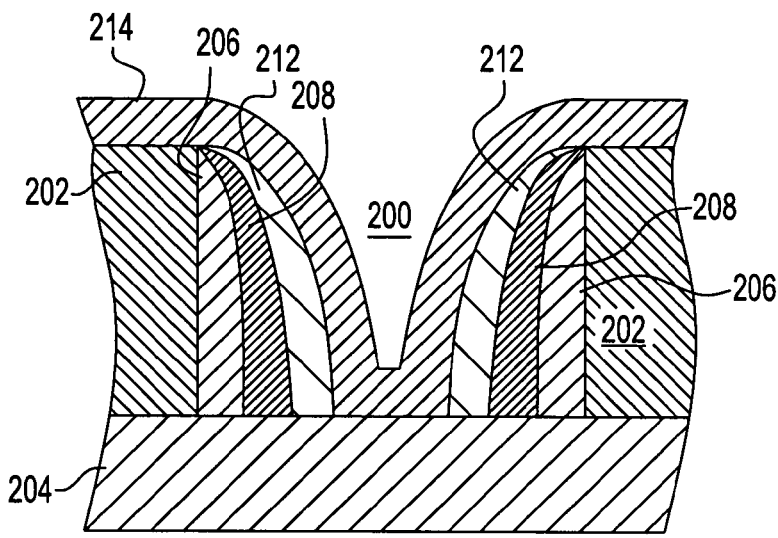
Figure 12D:
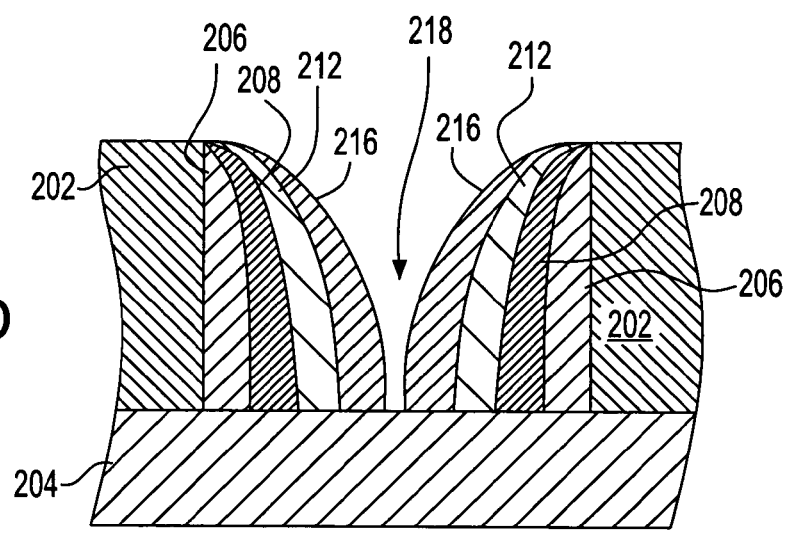
Figure 12E:
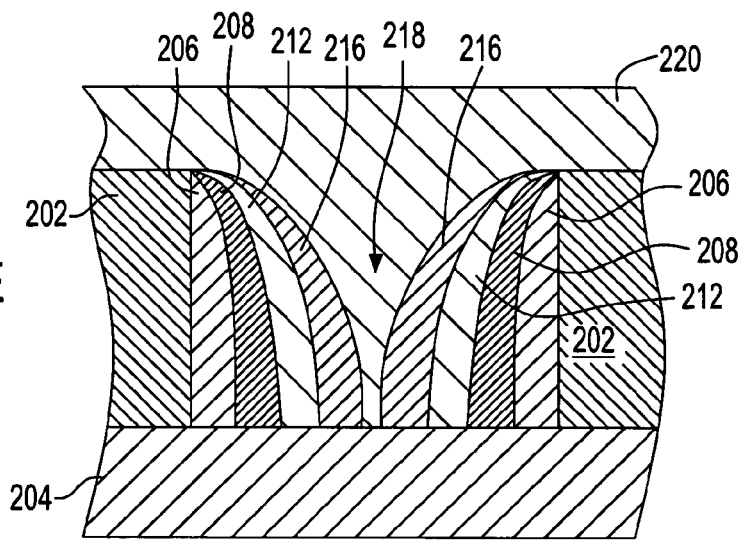

FIGS. 12A-E show an example of forming a stylus according to the preferred method of FIG. 10. In this example, the stylus is formed in an orifice 200 in a surface layer 202 to an underlying substrate layer 204. In this example, surface layer 202 and substrate layer 204 are shown as two distinct layers with the orifices 200 at locations that may each be for a stand-alone stylus formed independent of a memory cell, e.g., for a MEMS or AFM application. However, for a memory cell (e.g., 140 and 160 in FIGS. 5A-7C and 8A-B above) application, orifice 200 may be above the lower memory stack layers 132, 134 surrounded by a field dielectric layer that includes surface dielectric layer 202. Successive conformal layers are deposited and isotropically etched to form sidewall spacers 206, 208, forming a ring around the interior of the orifices 200. For the memory cell example of FIG. 6D, successive 15 nm thick layers (approximately one quarter of the memory cell radius) are deposited for each of sidewall spacers 206, 208. Then, a third 15 nm thick conformal layer 210, is deposited completing the cross section in the example of FIG. 12A. After isotropically etching third conformal layer 210, a third spacer 212 is formed in FIG. 12B, also forming a ring around the interior of the orifice 200. Similarly, in FIG. 12C, a fourth 15 nm thick conformal layer 214 is formed and isotropically etched to form fourth spacers 216 in FIG. 12D, which completes a tapered mold 218 in the orifice 200. It should be noted that although spacer rings 206, 208, 212 and 216 are shown as individual layers, this is for illustration only and, because typical such spacers 206, 208, 212 and 216 are the same material, once formed, each would merge with previously formed spacer rings for a uniform, rather than layered, sidewall spacer defining the tapered mold 218. Finally, a layer of tip material is deposited to fill the tapered molds 218, forming a tapered stylus 220 in each as shown in FIG. 12E.

It should be noted that if an isotropic etch is employed that does not have a sputtering component, normally, the spacer would have the curvature of the deposited conformal film. Further, height is removed from each spacer 206, 208, 212 and 216 as it is slightly etched down with horizontal portion removal. Accordingly, the combined thickness of the four spacers must be less than half the height of the orifice 200 to avoid plugging the orifice 200. Thus of the sequential deposition of multiple layers to form the spacers avoids the problems that may be inherent in conformally depositing a single layer wherein the single layer (e.g., 146 in FIG. 6C) may plug the orifice.

Figure 13:
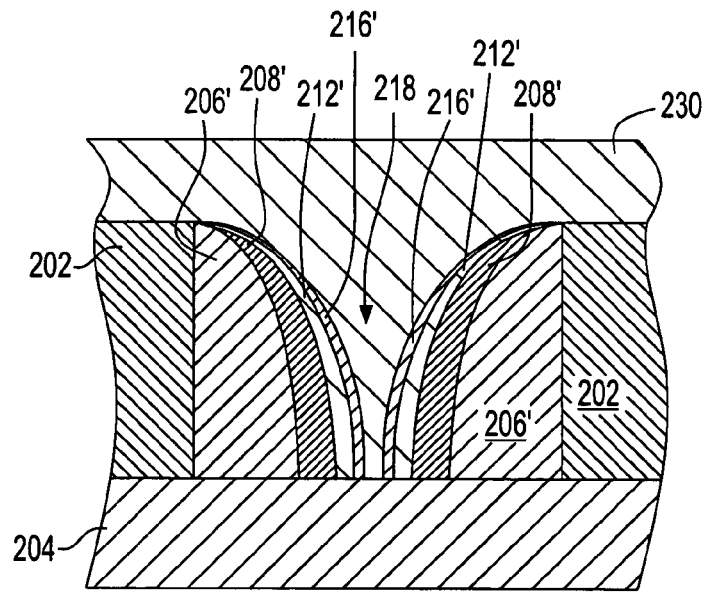
FIG. 13 shows a cross-section of another example of a preferred stylus by depositing sequentially thinner layer such that spacers decrease in thickness axially.

FIG. 13 shows a cross-section of another example of a preferred stylus 230 by depositing sequentially thinner layer such that spacers decrease in thickness axially, the initial layer is much thicker than the final layer. In this example the first or outer layer 206' is substantially thicker than the inner layers 208', 212' and 216'. In particular the outer layer 206' is from one quarter to one third the thickness of the horizontal dimension of the orifice. Subsequent spacer layers are each one quarter to one third as thick as the remaining opening at the bottom part of the spacer 208'. So, the effective thickness of each succeeding layer decreases geometrically with the number of layers. Finally, a stylus layer is deposited to form the stylus 230 in the tapered mold. As can be seen from FIGS. 12E and 13, the stylus 220, 230 thus formed has a much more pronounced apex, almost needle like. Advantageously, Joule heating is much more focused and pronounced by this needle like stylus than a stylus formed with a mold from a single spacer as described hereinabove with reference to FIG. 6A.

While the invention has been described in terms of preferred embodiments, those skilled in the art will recognize that the invention can be practiced with modification within the spirit and scope of the appended claims.

What is claimed is:

1. A stylus formed on an integrated circuit (IC) said IC including circuits formed on a semiconductor layer wired together in a plurality of wiring layers, said stylus being needle shaped and disposed above said semiconductor layer and extending upward from an apex, wherein at least a part of said stylus is contained within a tip mold, wherein said tip mold is disposed in a dielectric layer between a pair of said plurality of wiring layers and wherein current flowing through said stylus focuses Joule heating to said apex.

2. A stylus as in claim 1, wherein said stylus has a substantially circular horizontal cross section and increases in diameter from said apex and said stylus focuses Joule heating soldering-pencil-like to said apex.

3. A stylus as in claim 2, wherein said diameter increases non-linearly.

4. A stylus as in claim 1, wherein said stylus is a metal stylus.

5. A stylus as in claim 1, wherein said stylus is a doped semiconductor stylus.

6. A stylus as in claim 1, wherein said tip mold comprises a plurality of concentric layers.

7. A stylus as in claim 6, wherein said concentric layers are silicon nitride layers.

8. A stylus as in claim 6, wherein said concentric layers are silicon oxide layers.

9. An integrated circuit (IC) including circuits formed on a semiconductor layer wired together by wires in a plurality of wiring layers, at least one of said circuits including a soldering-pencil-like stylus focusing Joule heating to said apex soldering-pencil-like, said soldering-pencil-like stylus being disposed above said semiconductor layer and extending upward from an apex, said stylus at least partially contained in a tip mold, having a substantially circular horizontal cross section and increasing in diameter from said apex, wherein said tip mold is disposed in a dielectric layer between a pair of said plurality of wiring layers and wherein Joule heating from current flowing through said soldering-pencil-like stylus is focused to said apex.

10. An IC as in claim 9, wherein said soldering-pencil-like stylus is needle shaped and increases in diameter non-linearly from said apex.

11. An IC as in claim 10, wherein said soldering pencil like stylus is a conductive material.

12. An integrated circuit (IC) including circuits formed on a semiconductor layer wired together by wires in a plurality of wiring layers, at least one of said circuits including a needle-shaped, soldering-pencil-like stylus disposed within a tip mold above said semiconductor layer and extending upward from an apex from one of said plurality of wiring layers, wherein said tip mold is disposed in a dielectric layer between a pair of said plurality of wiring layers and current flowing through said needle-shaped, soldering-pencil-like stylus focuses Joule heating soldering-pencil-like to said apex.

13. An IC as in claim 12, wherein said needle-shaped, soldering-pencil-like stylus has a substantially circular horizontal cross section and increases in diameter from said apex.

14. An IC as in claim 13, wherein said diameter increases non-linearly.

15. An IC as in claim 12, wherein said needle-shaped, soldering-pencil-like stylus is a metal stylus.

16. An IC as in claim 12, wherein said needle-shaped, soldering-pencil-like stylus is a doped semiconductor stylus.

17. An IC as in claim 12, wherein said tip mold comprises a plurality of concentric dielectric layers.

\* \* \* \* \*